United States Patent
Takahashi

[19]

[11] Patent Number: 5,832,033
[45] Date of Patent: Nov. 3, 1998

[54] CLOCK DISTURBANCE DETECTION BASED ON RATIO OF MAIN CLOCK AND SUBCLOCK PERIODS

[75] Inventor: Yasunori Takahashi, Tokyo, Japan

[73] Assignee: NEC Corporation, Tokyo, Japan

[21] Appl. No.: 593,212

[22] Filed: Jan. 29, 1996

[30] Foreign Application Priority Data

Jan. 27, 1995 [JP] Japan .................................. 7-011601

[51] Int. Cl.$^6$ ................................................ H04L 25/34
[52] U.S. Cl. .............................................. 375/289; 341/56
[58] Field of Search .................................. 341/56, 57, 58, 341/68; 371/56, 57.1; 375/288, 289, 244, 213; 370/276, 282, 359, 384, 465, 499; 379/26, 12

[56] References Cited

U.S. PATENT DOCUMENTS

| | | | |
|---|---|---|---|
| 3,938,082 | 2/1976 | Schowe, Jr. ........................ | 371/56 |
| 4,001,578 | 1/1977 | Cook et al. ........................ | 341/57 |
| 4,006,304 | 2/1977 | Sell .................................. | 341/57 |
| 4,086,566 | 4/1978 | Lender .............................. | 371/56 |
| 4,750,179 | 6/1988 | Davidow et al. ................... | 371/56 |
| 4,887,083 | 12/1989 | Kosugi et al. ..................... | 375/289 |
| 5,109,391 | 4/1992 | Kurobe ............................. | 375/288 |

FOREIGN PATENT DOCUMENTS 3-272245   3/1991   Japan .

*Primary Examiner*—Stephen Chin
*Assistant Examiner*—Joseph Roundtree
*Attorney, Agent, or Firm*—Scully, Scott, Murphy & Presser

[57] ABSTRACT

A bipolar-clock monitor circuit includes a first shift register shifting positive-polarity pulse signal according to the negative-polarity pulse signal to produce a i-bit-shift signal and a j-bit-shift signal. The integers i and j are determined based on the period ratio of a main clock and a subclock included in the bipolar clock signal so that the i-bit-shift signal is identical with the j-bit-shift signal when the bipolar clock signal is normal. The non-coincidence determination circuit checks whether the i-bit-shift signal coincides with the j-bit-shift signal and produces a disturbance detection signal when the i-bit-shift signal does not coincide with the j-bit-shift signal.

20 Claims, 4 Drawing Sheets

CLOCK DISTURBANCE DETECTION BASED ON RATIO OF MAIN CLOCK AND SUBCLOCK PERIODS

BACKGROUND OF THE INVENTION

1. Field of the invention

The present invention generally relates to a clock monitor circuit, and in particular to a circuit for detecting a clock disturbance which occurs due to the mixing of similar pulses into or lack of necessary pulses of a bipolar clock signal.

2. Description of the Related Art

A bipolar clock generally consists of a pulse stream with the polarity alternating in time as follows: +1, 0, −1, 0, +1, and so on. However, it is well known as a bipolar violation method that the polarity alternation order is violated in a predetermined period like this: +1, 0, +1, 0, −1, 0, and so on. Such a bipolar violation method is frequently employed to superimpose a subclock on a main clock. A clock extractor extracts the subclock from the bipolar clock and supplies it as a reference phase clock to a data processing circuit. For such a clock extractor, a clock monitor circuit is necessary to avoid recognizing a pulse disturbance as the bipolar violation.

A clock extracting circuit employing the bipolar violation method is disclosed in Japanese Patent Unexamined Publication No. 3-272245. Referring to FIG. 1, a positive-polarity pulse detector 1 detects a positive-pulse signal S1 from the bipolar clock signal by comparing the bipolar clock signal with a first reference voltage Ref-p. Similarly, a negative-polarity pulse detector 2 detects a negative-pulse signal S2 from the bipolar clock signal by comparing the bipolar clock signal with a second reference voltage Ref-n. After the bipolar clock signal has been divided into the positive-pulse signal S1 and the negative-pulse signal S2, a bipolar violation detector 3 receives them to detect the subclock signal. The clock extracting circuit further includes a clock monitor circuit comprising two counters 4 and 5 and a comparator 6. The respective counters 4 and 5 count pulses of the positive-pulse signal S1 and the negative-pulse signal S2 while concurrently reset in a predetermined period. The comparator 6 compares the resultant count values of the counters 4 and 5 in the predetermined period and produces an alarm signal when the count difference is larger than predetermined.

However, the conventional clock monitor circuit cannot detect a clock disturbance in cases where equal numbers of pulses are mixed into or removed from both the positive-pulse signal S1 and the negative-pulse signal S2, because the conventional clock monitor circuit detects the clock disturbance based on the count difference between the counters 4 and 5 separately counting positive pulses and negative pulses, respectively.

SUMMARY OF THE INVENTION

An object of the present invention is to provide a clock monitor circuit which detects a clock disturbance with reliability.

Another object of the present invention is to provide a clock disturbance detecting circuit and method which properly detect a clock disturbance such as a case where the positive- and negative-pulses both change in number.

According to the present invention, a first-polarity pulse signal and a second-polarity pulse signal are produced from a bipolar pulse signal including a main pulse signal and a subpulse signal. The period of the subpulse signal is a predetermined integral multiple of that of the main pulse signal. A first disturbance is detected from the first-polarity pulse signal by checking whether a first pulse signal coincides with a second pulse signal using said second-polarity pulse signal as a first timing signal. The first pulse signal corresponds to the first-polarity pulse signal at a first timing instant and the second pulse signal corresponds to the first-polarity pulse signal at a second timing instant. The timing difference between the first and second timing instants corresponds to the period ratio of the main pulse signal and the subpulse signal. The first disturbance is detected when the first pulse signal does not coincide with the second pulse signal.

According to an aspect of the present invention, a circuit is comprised of a shift register which shifts first data corresponding to the first-polarity pulse signal in accordance with the first timing signal to produce the first pulse signal and the second pulse signal. The circuit is further comprised of a coincidence checking circuit which checks whether the first pulse signal coincides with the second pulse signal to produce a first detection signal indicating the first disturbance when the first pulse signal is not identical with the second pulse signal.

According to another aspect of the present invention, the circuit is further comprised of a shift register which shifts second data corresponding to the second-polarity pulse signal using the second-polarity pulse signal as a second timing signal and produces the third pulse signal and the fourth pulse signal. The circuit is still further comprised of a coincidence checking circuit which checks whether the third pulse signal coincides with the fourth pulse signal to produce a second detection signal indicating the second disturbance when the third pulse signal is not identical with the fourth pulse signal. The circuit is still more further comprised of an output circuit for producing a detection signal of the bipolar pulse disturbance based on the first disturbance and the second disturbance. For instance, the output circuit is a logical-OR circuit which receives the first disturbance and the second disturbance.

In cases where no bipolar pulse disturbance occurs, since the shift register shifts the data according to the second-polarity pulse signal and the data stored in the shift register always has a predetermined repetition period of the subpulse, the first data and the second data are identical at all times.

On the contrary, once an extra pulse is added to or a necessary pulse slips away from the bipolar pulse signal, the pulse repetition order is vanished, resulting in non-coincidence between the first data and the second data of the shift register. Therefore, the disturbance signal is produced by the comparator when a bipolar pulse disturbance occurs. Since the logical-OR circuit receives the first disturbance signal and the second disturbance signal, the circuit detects the bipolar pulse disturbance when at least one of the first disturbance signal and the second disturbance signal occurs.

DETAILED DESCRIPTION OF THE PREFERRED EMBODIMENTS

Figure 1:
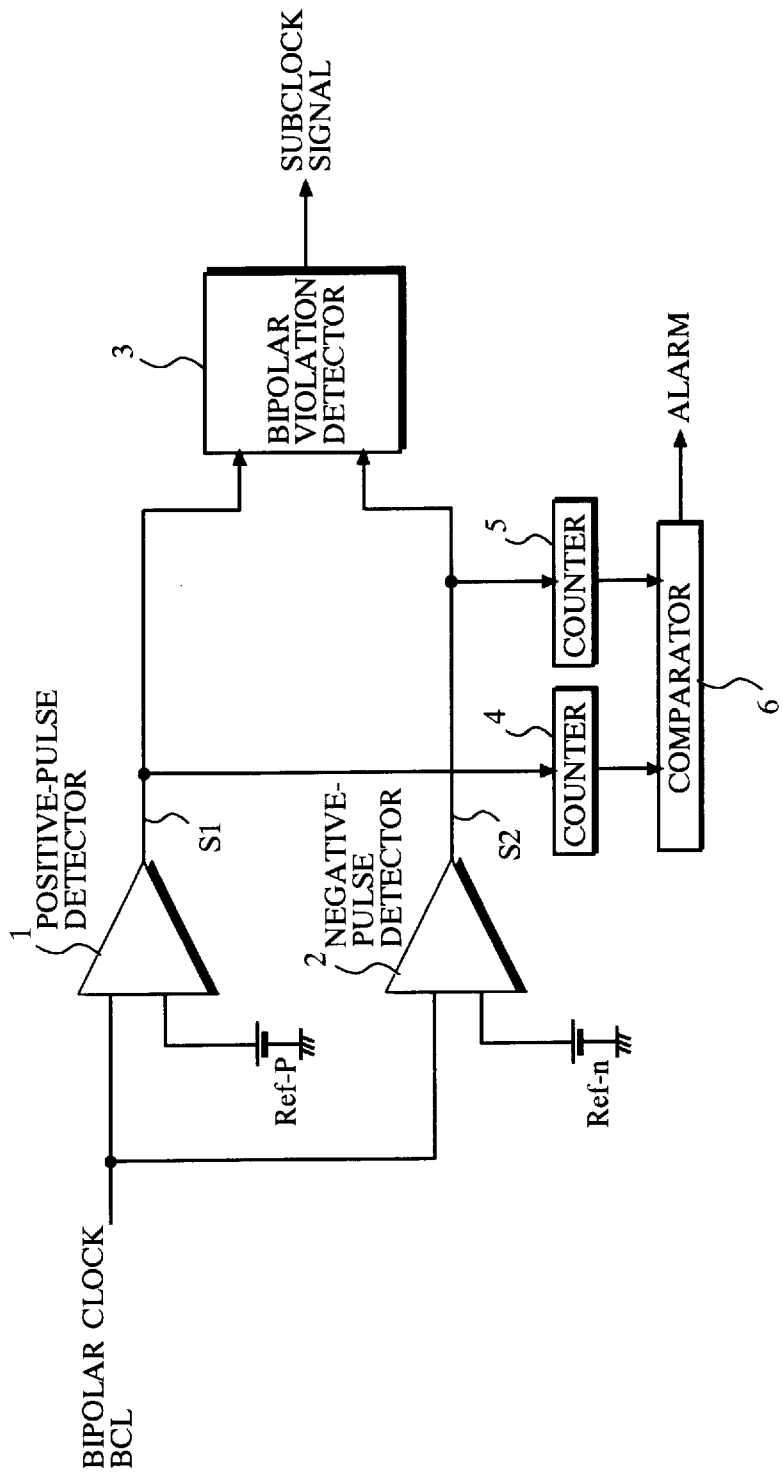
FIG. 1 is a block diagram showing a clock extracting circuit employing a conventional clock monitor circuit.
Figure 2:
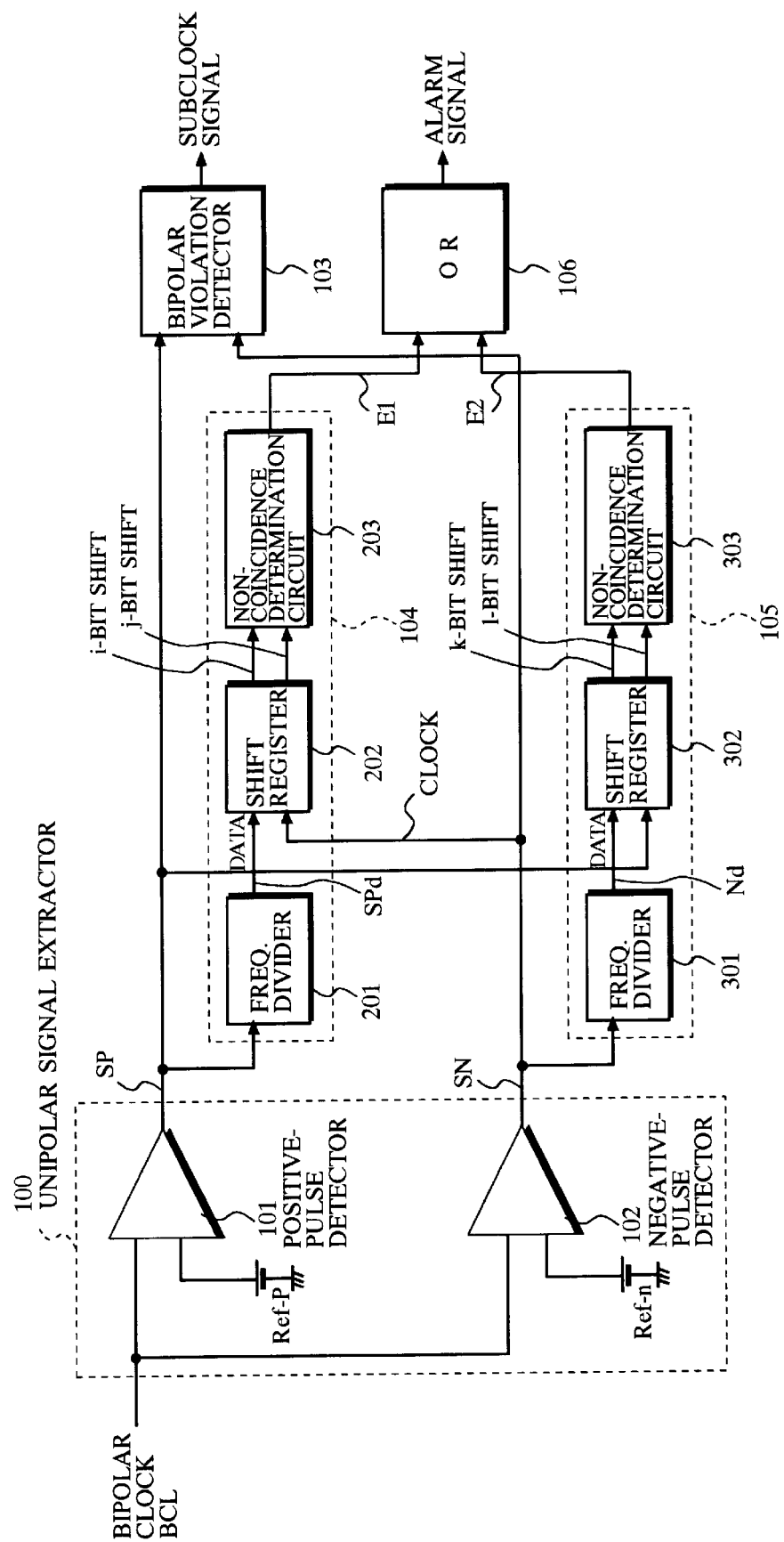
FIG. 2 is a block diagram showing a clock extracting circuit employing a clock monitor circuit according to an embodiment of the present invention.

Referring to FIG. 2, a clock extractor according to an embodiment of the present invention receives a bipolar clock signal BCL including a main clock of a period $T_m$ and a subclock of a period $T_{sub}$ superimposed on the main clock and produces the subclock and an alarm signal which indicates a clock disturbance.

The clock extractor is comprised of a unipolar signal extractor 100 including a positive-polarity pulse detector 101 and a negative-polarity pulse detector 102 which receive the bipolar clock signal BCL and produce a positive-polarity pulse signal SP and a negative-polarity pulse signal SN, respectively. As described above, the positive-polarity pulse detector 101 detects the positive-polarity pulse signal SP from the bipolar clock signal BCL by comparing the bipolar clock signal BCL with the first reference voltage Ref-p. Similarly, the negative-polarity pulse detector 102 detects the negative-polarity pulse signal SN from the bipolar clock signal BCL by comparing the bipolar clock signal BCL with the second reference voltage Ref-n. As well known, the positive-polarity and negative-polarity pulse detectors 101 and 102 are both formed with a differential amplifier. A bipolar violation detector 103 receives the positive-polarity and negative-polarity pulse signals SP and SN and reproduces the subclock signal superimposed on the bipolar clock signal BCL.

The clock extractor is further provided with a first error detector 104, a second error detector 105, and an OR circuit 106. The first error detector 104 and the second error detector 105 receive the positive-polarity and negative-polarity pulse signals SP and SN, respectively, and output a first error signal E1 and a second error signal E2 to the OR circuit 106. The OR circuit produces the alarm signal when receiving at least one of the first error signal E1 and the second error signal E2.

The first error detector 104 is comprised of a frequency divider 201, a shift register 202, and a non-coincidence determination circuit 203. The frequency divider 201 divides the positive-polarity pulse signal SP in frequency to output the divided signal SPd to the shift register 202. Receiving the divided signal SPd as data, the shift register 202 shifts the data in accordance with the negative-polarity pulse signal SN which is received as a shift clock from the negative-polarity pulse detector 102. The shift register 202 outputs first data shifted by i bits and second data shifted by j bits to the non-coincidence determination circuit 203, where i and j are a positive integer and are determined based on a ratio of the periods $T_m$ and $T_{sub}$ of the main clock and the subclock as described later. The non-coincidence determination circuit 203 receives the first data and the second data from the shift register 202 and outputs the error signal E1 to the OR circuit 106 when the first data is not identical with the second data.

Similarly, the second error detector 105 is comprised of a frequency divider 301, a shift register 302, and a non-coincidence determination circuit 303. The frequency divider 301 divides the negative-polarity pulse signal SN in frequency to output the divided signal SNd to the shift register 302. Receiving the divided signal SNd as data, the shift register 302 shifts the data in accordance with the positive-polarity pulse signal SP which is received as a shift clock from the positive-polarity pulse detector 101. The shift register 302 outputs third data shifted by k bits and fourth data shifted by l bits to the non-coincidence determination circuit 303, where k and l are a positive integer and are determined based on a ratio of the periods $T_m$ and $T_{sub}$ of the main clock and the subclock as described later. The non-coincidence determination circuit 303 receives the third data and the fourth data from the shift register 302 and outputs the error signal E2 to the OR circuit 106 when the third data and the fourth data are not identical.

Figure 3:
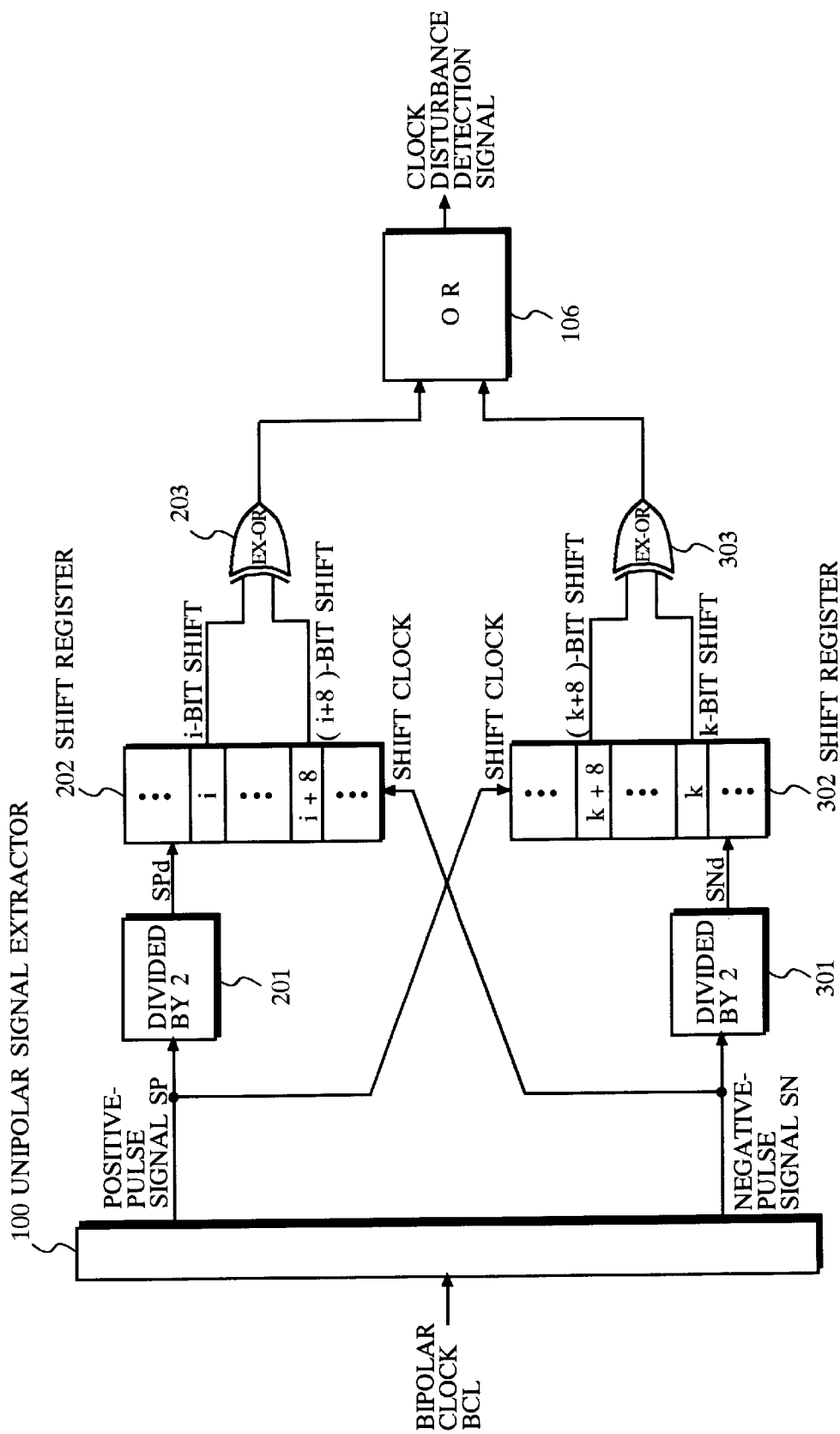
FIG. 3 is a detailed block diagram showing the clock monitor circuit according to the embodiment.

Referring to FIG. 3, a more detailed circuit arrangement of the clock monitor circuit will be described hereinafter. In the first error detector 104, the frequency divider 201 divides the positive-polarity pulse signal SP in frequency by two and outputs the divided signal SPd to the serial input terminal of the shift register 202. The shift register 202 has two parallel output terminals corresponding to the i-bit shift and the (i+8)-bit shift, respectively. In this case, it is assumed that the period $T_{sub}$ of the subclock is 8 times the period $T_m$ of the main clock. The stored data is shifted in accordance with the negative-polarity pulse signal SN which is received as a shift clock from the negative-polarity pulse detector 102. The shift register 202 outputs the first data shifted by i bits and the second data shifted by i+8 bits in parallel to an exclusive-OR circuit 203 which serves as the non-coincidence determination circuit. Receiving the first data and the second data from the shift register 202, the exclusive-OR circuit 203 outputs the error signal E1 to the OR circuit 106 when the first data is not identical with the second data.

The second error detector 105 has the same circuit configuration as the first error detector 104 except that the shift register 302 operates in accordance with the positive-polarity pulse signal SP serving as a shift clock. The shift register 302 outputs the third data shifted by k bits and the fourth data shifted by k+8 bits in parallel to an exclusive-OR circuit 303 which outputs the error signal E2 to the OR circuit 106 when the third data is not identical with the fourth data. Taking the second error detector 105 as an example, an operation of the clock monitor circuit will be described hereinafter.

Figure 4:
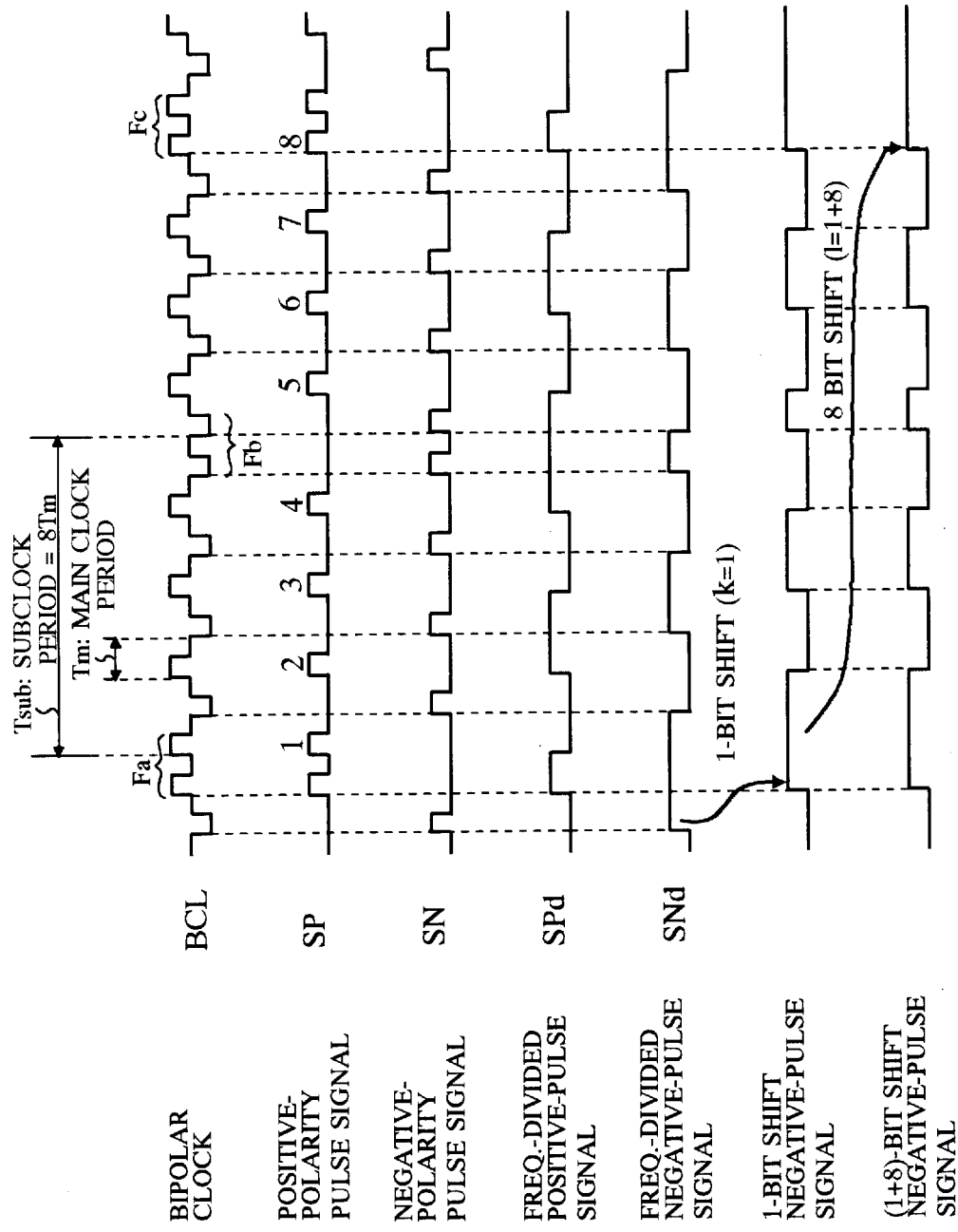
FIG. 4 is a timing chart showing an operation of the clock monitor circuit as shown in FIG. 3.

As illustrated in FIG. 4, it is assumed that the bipolar clock BCL has the main clock period $T_m$ and the subclock period $T_{sub}$ (=$8T_m$) with the bipolar violation occurring in period $T_{sub}$ ($F_a$, $F_b$, $F_c$, and so on) and the integer numbers i and k are set at 1. Since the ratio of the subclock period $T_{sub}$ to the main clock period $T_m$ is 8, the shift-bit difference between the parallel output terminals is also set at 8 in each of the shift registers 202 and 203. It is needless to say that the shift-bit difference may be set at an integral multiple of 8. The positive-polarity pulse signal SP and the negative-polarity pulse signal SN each having a repetition period $2T_{sub}$ are output to the frequency dividers 201 and 301, respectively. The frequency divider 301 divides the negative-polarity pulse signal SN in frequency by two to output the divided pulse signal SNd to the shift register 302.

In cases where no clock disturbance occurs, since the shift register 302 shifts the data according to the positive-polarity pulse signal SP and the divided-by-2 pulse signal SNd always has the repetition period $2T_{sub}$, the third data shifted by 1 bit and the fourth data shifted by 1+8 bits are identical at all times as shown in FIG. 4. On the contrary, once an extra pulse is added or a necessary pulse slips away, the pulse repetition order is vanished, resulting in non-coincidence between the 1-bit-shift data and the (1+8)-bit-shift data of the shift register 302. Therefore, the error signal E2 of a logical high value is output from the exclusive-OR circuit 303 to the OR circuit 106 when a clock disturbance occurs.

Needless to say, the first error detector 104 performs the similar operation to the second error detector 105. Since the OR circuit 106 outputs a clock disturbance detection signal of a logical high value when at least one of the error signals E1 and E2 goes high, a bipolar clock disturbance can be detected with reliability even when the same clock disturbance occurs in both the positive-polarity and the negative-polarity pulses.

What is claimed is:

1. A circuit for detecting a bipolar pulse disturbance, comprising:

means for extracting a unipolar pulse signal from a bipolar pulse signal, said bipolar pulse signal including a main pulse signal and a subpulse signal, a period of said subpulse signal being a predetermined integral multiple of that of said main pulse signal; and disturbance detecting means for detecting a pulse disturbance from said unipolar pulse signal by checking whether a first pulse signal coincides with a second pulse signal, said first pulse signal corresponding to said unipolar pulse signal at a first timing instant, said second pulse signal corresponding to said unipolar pulse signal at a second timing instant, a timing difference between said first timing instant and said second timing instant being determined based on a period ratio of said main pulse signal and said subpulse signal, said disturbance detecting means detecting said pulse disturbance when said first pulse signal does not coincide with said second pulse signal.

2. The circuit according to claim 1, wherein:

said disturbance detecting means comprises:

data shifting means for shifting data corresponding to said unipolar pulse signal so as to produce said first pulse signal and said second pulse signal, said first pulse signal corresponding to said unipolar pulse signal at said first timing instant, said second pulse signal corresponding to said unipolar pulse signal at said second timing instant, said timing difference between said first timing instant and said second timing instant being determined based on said period ratio of said main pulse signal and said subpulse signal; and coincidence checking means for checking whether said first pulse signal coincides with said second pulse signal and producing a detection signal indicating said pulse disturbance when said first pulse signal does not coincide with said second pulse signal.

3. The circuit according to claim 2, wherein:

said disturbance detecting means further comprises:

frequency dividing means for dividing said unipolar pulse signal in frequency by a predetermined integer to output said data to said data shifting means.

4. A circuit for detecting a bipolar pulse disturbance, comprising:

first means for extracting a first-polarity pulse signal and a second-polarity pulse signal from a bipolar pulse signal including a main pulse signal and a subpulse signal, a period of said subpulse signal being a predetermined integral multiple of that of said main pulse signal;

first detecting means for detecting a first disturbance from said first-polarity pulse signal by checking whether a first pulse signal coincides with a second pulse signal using said second-polarity pulse signal as a first timing signal, said first pulse signal corresponding to said first-polarity pulse signal at a first timing instant, said second pulse signal corresponding to said first-polarity pulse signal at a second timing instant, a timing difference between said first timing instant and said second timing instant being determined based on a period ratio of said main pulse signal and said subpulse signal, said first detecting means detecting said first disturbance when said first pulse signal does not coincide with said second pulse signal;

second detecting means for detecting a second disturbance from said second-polarity pulse signal by checking whether a third pulse signal coincides with a fourth pulse signal using said first-polarity pulse signal as a second timing signal, said third pulse signal corresponding to said second-polarity pulse signal at a third timing instant, said fourth pulse signal corresponding to said second-polarity pulse signal at a fourth timing instant, a timing difference between said third timing instant and said fourth timing instant being determined based on said period ratio of said main pulse signal and said subpulse signal, said second detecting means detecting said second disturbance when said third pulse signal does not coincide with said fourth pulse signal; and second means for producing a detection signal of said bipolar pulse disturbance based on said first disturbance and said second disturbance.

5. The circuit according to claim 4, wherein:

said first detecting means comprises:

first data shifting means for shifting first data corresponding to said first-polarity pulse signal in accordance with said first timing signal so as to produce said first pulse signal and said second pulse signal, said first pulse signal corresponding to said first-polarity pulse signal at said first timing instant, said second pulse signal corresponding to said first-polarity pulse signal at said second timing instant, said timing difference between said first timing instant and said second timing instant being determined based on said period ratio of said main pulse signal and said subpulse signal; and first coincidence checking means for checking whether said first pulse signal coincides with said second pulse signal and producing a first detection signal indicating said first disturbance when said first pulse signal does not coincide with said second pulse signal.

6. The circuit according to claim 5, wherein said second detecting means comprises:

second data shifting means for shifting second data corresponding to said second-polarity pulse signal in accordance with said second timing signal so as to produce said third pulse signal and said fourth pulse signal, said third pulse signal corresponding to said second-polarity pulse signal at said third timing instant, said fourth pulse signal corresponding to said second-polarity pulse signal at said third timing instant, said timing difference between said third timing instant and said fourth timing instant being determined based on said period ratio of said main pulse signal and said subpulse signal; and second coincidence checking means for checking whether said third pulse signal coincides with said fourth pulse signal and producing a second detection signal indicating said second disturbance when said third pulse signal does not coincide with said fourth pulse signal.

7. The circuit according to claim 5, wherein:

said first detecting means further comprises:

first frequency dividing means for dividing said first-polarity pulse signal in frequency by a predetermined integer to output said first data to said first data shifting means.

8. The circuit according to claim 6, wherein:

said second detecting means further comprises:

second frequency dividing means for dividing said second-polarity pulse signal in frequency by said predetermined integer to output said second data to said second data shifting means.

9. The circuit according to claim 4, wherein said second means is a logical-OR circuit for producing said detection signal when at least one of said first disturbance and said second disturbance is received.

10. A bipolar-clock monitor circuit comprising:

a unipolar extracting circuit for extracting a first-polarity pulse signal and a second-polarity pulse signal from a bipolar clock signal including a main clock signal and a subclock signal, a period of said subclock signal being a predetermined integral multiple of that of said main clock signal;

a first disturbance detecting circuit for detecting a disturbance from said first-polarity pulse signal by checking whether a first pulse signal coincides with a second pulse signal, said first pulse signal corresponding to said first-polarity pulse signal at a first timing instant, said second pulse signal corresponding to said first-polarity pulse signal at a second timing instant, a timing difference between said first timing instant and said second timing instant being determined according to a period ratio of said main clock signal and said subclock signal, said first disturbance detecting circuit detecting said disturbance when said first pulse signal does not coincide with said second pulse signal; and a second disturbance detecting circuit for detecting said disturbance from said second-polarity pulse signal by checking whether a third pulse signal coincides with a fourth pulse signal, said third pulse signal corresponding to said second-polarity pulse signal at a third timing instant, said fourth pulse signal corresponding to said second-polarity pulse signal at a fourth timing instant, a timing difference between said third timing instant and said fourth timing instant being determined according to said period ratio of said main clock signal and said subclock signal, said second disturbance detecting circuit detecting said disturbance when said third pulse signal does not coincide with said fourth pulse signal.

11. The bipolar-clock monitor circuit according to claim 10, wherein:

said first disturbance detecting circuit comprises:

a first shift register for shifting first data corresponding to said first-polarity pulse signal in accordance with said second-polarity pulse signal to produce said first pulse signal and said second pulse signal, said first pulse signal corresponding to said first-polarity pulse signal at said first timing instant, said second pulse signal corresponding to said first-polarity pulse signal at said second timing instant, said timing difference between said first timing instant and said second timing instant being determined according to said period ratio of said main clock signal and said subclock signal; and a first coincidence determination circuit for checking whether said first pulse signal coincides with said second pulse signal and producing a first detection signal when said first pulse signal does not coincide with said second pulse signal;

said second disturbance detecting circuit comprises:

a second shift register for shifting second data corresponding to said second-polarity pulse signal in accordance with said first-polarity pulse signal to produce said third pulse signal and said fourth pulse signal, said third pulse signal corresponding to said second-polarity pulse signal at said third timing instant, said fourth pulse signal corresponding to said second-polarity pulse signal at said fourth timing instant, said timing difference between said third timing instant and said fourth timing instant being determined according to said period ratio of said main clock signal and said subclock signal;

a second coincidence determination circuit for checking whether said third pulse signal coincides with said fourth pulse signal and producing a second detection signal when said third pulse signal does not coincide with said fourth pulse signal; and said bipolar-clock monitor circuit further comprising:

a disturbance signal producing circuit for producing a disturbance signal indicating said disturbance based on said first detection signal and said second detection signal.

12. The bipolar-clock monitor circuit according to claim 11, wherein:

said first disturbance detecting circuit further comprises a first frequency divider for dividing said first-polarity pulse signal in frequency by a predetermined integer to output said first data to said first shift register; and said second disturbance detecting circuit further comprises a second frequency divider for dividing said second-polarity pulse signal in frequency by a predetermined integer to output said second data to said second shift register.

13. The circuit according to claim 1, wherein said subpulse signal included in said bipolar pulse signal is superposed on said main pulse signal with bipolar violations occurring in said period of said subpulse signal.

14. The circuit according to claim 4, wherein said subpulse signal included in said bipolar pulse signal is superposed on said main pulse signal with bipolar violations occurring in said period of said subpulse signal.

15. The bipolar-clock monitor circuit according to claim 10, wherein said subpulse signal included in said bipolar pulse signal is superposed on said main pulse signal with bipolar violations occurring in said period of said subpulse signal.

16. A method for detecting a bipolar pulse disturbance, comprising the steps of:

producing a first-polarity pulse signal and a second-polarity pulse signal from a bipolar pulse signal including a main pulse signal and a subpulse signal, a period of said subpulse signal being a predetermined integral multiple of that of said main pulse signal;

storing first data corresponding to said first-polarity pulse signal;

shifting said first data in accordance with a first timing signal so as to produce a first pulse signal and a second pulse signal, said first pulse signal corresponding to said first-polarity pulse signal at a first timing instant, said second pulse signal corresponding to said first-polarity pulse signal at a second timing instant, a timing difference between said first timing instant and said second timing instant being determined according to a period ratio of said main pulse signal and said subpulse signal;

checking whether said first pulse signal coincides with said second pulse signal; and producing a detection signal indicating said bipolar pulse disturbance when said first pulse signal does not coincide with said second pulse signal.

17. A method for detecting a bipolar pulse disturbance, comprising the steps of:

producing a first-polarity pulse signal and a second-polarity pulse signal from a bipolar pulse signal including a main pulse signal and a subpulse signal, a period of said subpulse signal being a predetermined integral multiple of that of said main pulse signal;

storing first data corresponding to said first-polarity pulse signal;

shifting said first data in accordance with said second-polarity pulse signal so as to produce a first pulse signal and a second pulse signal, said first pulse signal corresponding to said first-polarity pulse signal at a first timing instant, said second pulse signal corresponding to said first-polarity pulse signal at a second timing instant, a timing difference between said first timing instant and said second timing instant being determined according to a period ratio of said main pulse signal and said subpulse signal;

checking whether said first pulse signal coincides with said second pulse signal;

producing a first detection signal when said first pulse signal does not coincide with said second pulse signal;

storing second data corresponding to said second-polarity pulse signal;

shifting said second data in accordance with said first-polarity pulse signal so as to produce a third pulse signal and a fourth pulse signal, said third pulse signal corresponding to said second-polarity pulse signal at a third timing instant, said fourth pulse signal corresponding to said second-polarity pulse signal at a third timing instant, a timing difference between said third timing instant and said fourth timing instant being determined according to said period ratio of said main pulse signal and said subpulse signal;

checking whether said third pulse signal coincides with said fourth pulse signal;

producing a second detection signal when said third pulse signal does not coincide with said fourth pulse signal; and producing a disturbance detection signal indicating said bipolar pulse disturbance based on said first detection signal and said second detection signal.

18. The method according to claim 17, wherein said disturbance detection signal is produced by a logical OR function on said first detection signal and said second detection signal.

19. The method according to claim 16, wherein said subpulse signal included in said bipolar pulse signal is superposed on said main pulse signal with bipolar violations occurring in said period of said subpulse signal.

20. The method according to claim 17, wherein said subpulse signal included in said bipolar pulse signal is superposed on said main pulse signal with bipolar violations occurring in said period of said subpulse signal.

* * * * *